(12) United States Patent
Matsui et al.

(10) Patent No.: US 6,407,580 B1
(45) Date of Patent: *Jun. 18, 2002

(54) LATCH SENSE AMPLIFIER CIRCUIT WITH AN IMPROVED NEXT STAGE BUFFER

(75) Inventors: Yuuji Matsui; Hiroyuki Takahashi, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/362,026

(22) Filed: Jul. 28, 1999

(30) Foreign Application Priority Data

Jul. 28, 1998 (JP) .......................................... 10-212479

(51) Int. Cl.[7] .......................................... H03K 19/0175
(52) U.S. Cl. .......................................... 326/82; 326/83
(58) Field of Search ..................................... 326/82, 83

(56) References Cited

U.S. PATENT DOCUMENTS 6,094,067 A * 7/2000 Taniguchi .................... 326/68

FOREIGN PATENT DOCUMENTS

| JP | 2-302992 | 12/1990 |
|----|----------|---------|
| JP | 6-180991 | 6/1994 |
| JP | 9-245483 | 9/1997 |
| JP | 10-65500 | 3/1998 |
| JP | 10-144083 | 5/1998 |

* cited by examiner

*Primary Examiner*—Trong Phan
(74) *Attorney, Agent, or Firm*—Sughrue, Mion, Zinn, Macpeak & Seas, PLLC

(57) ABSTRACT

The present invention provides a next stage buffer receiving a pair of complementary signals from a flip-flop in a latch sense amplifier circuit, wherein the next stage buffer comprises: a plurality of logic gates of the same type, each of which individually includes a series connection of at least an individual first conductivity type field effect transistor individually provided to the plurality of logic gates and a common first conductivity type field effect transistor commonly provided to the plurality of logic gates, and the common first conductivity type field effect transistor is connected to a carrier supply line which supplies carriers to the common first conductivity type field effect transistor, so that the plurality of logic gates have a common node between the first conductivity type field effect transistors and the common first conductivity type field effect transistor.

14 Claims, 5 Drawing Sheets

LATCH SENSE AMPLIFIER CIRCUIT WITH AN IMPROVED NEXT STAGE BUFFER

BACKGROUND OF THE INVENTION

The present invention relates to a sense amplifier circuit, and more particularly to a latch sense amplifier circuit to be used in a semiconductor memory device.

Recently, due to increases in the requirement for improvements in high speed performances of semiconductor devices and for possible reduction in power consumption of semiconductor devices, semiconductor memory devices are also requited to have improved high speed performance and reduced power consumption.

There are known different types of the sense amplifier circuits, wherein a latch type sense amplifier circuit is advantageous for zero stand-by current consumption and also is capable of high speed amplification of a small slight potential difference generated by memory cells. This latch sense amplifier circuit is, however, disadvantageous in that any malfunction is likely to appear on the sense amplifier circuit because a flip-flop in a latch circuit performs an amplification by a slight potential difference of several tens of millivolts. In order to avoid any malfunction of the sense amplifier circuit, a sufficient margin for potential difference is needed.

FIG. 1 is a circuit diagram illustrative of a conventional latch sense amplifier circuit. The conventional latch sense amplifier circuit comprises a flip-flop 1, a transfer gate 2, a next stage buffer 3A and an output circuit 4. The flip-flop 1 performs a high speed amplification of data from memory cells up to a level defined to be a difference of a high power voltage Vcc from a ground potential GND so as to output paired complementary signals therefrom. The transfer gate 2 is connected between the flip-flop 1 and the read buses RBT and RBB, so that the transfer gate 2 disconnects the flip-flop 1 from read buses RBT and RBB for latching data from the memory cells. The next stage buffer 3A is connected to an output side of the flip-flop 1 for receiving the amplified complementary signals from the flip-flop 1. The output circuit 4 are connected to the next stage buffer 3A for receiving output from the next stage buffer 3A to output the amplified memory cell data.

The flip-flop 1 has a parallel connection of first and second inverters INV1 and INV2 between both nodes SAT and SAB. Directions of the first and second inverters INV1 and INV2 are opposite to each other to form a closed loop. Namely, an output side of the first inverter INV1 is connected to an input side of the second inverter INV2 and an output side of the second inverter INV2 is connected to an input side of the first inverter INV1. Power terminals of the first and second inverters INV1 and INV2 are supplied with a second sense amplifier activation signal SE2 If the second sense amplifier activation signal SE2 is low level or inactivated level, then the flip-flop 1 is inactivated to be inoperable. Ground terminals of the first and second inverters INV1 and INV2 are connected through an n-channel MOS field effect transistor Q1 to a ground line GND. The n-channel MOS field effect transistor Q1 has a gate receiving a first sense amplifier activation signal SE1. If the fist sense amplifier activation signal SE1 is low level, then the nodes SAT and SAB awe kept to be the high power voltage level Vcc.

The transfer gate 2 has first and second p-channel MOS field effect transistors Q2 and Q3 which have gates receiving the second sense amplifier activation signal SE2. The first p-channel MOS field effect transistor Q2 is connected in series between the read bus RBT and the node SAT. The second p-channel MOS field effect transistor Q3 is connected in series between the read bus RBB and the node SAB which are connected to the opposite sides of the closed loops. If the second sense amplifier activation signal SE2 is high level, then the flip-flop 1 is disconnected from the read buses RBT and RBB.

The next stage buffer 3A and the output circuit 4 have well known circuit configurations as disclosed in Japanese laid-open patent publications Nos. 3-41820 and 4-109494.

The next stage buffer 3A has a pair of first and second NOR gates NOR1 and NOR2. One input of each of the first and second NOR gates NOR1 and NOR2 is connected to an output side of a third inverter INV3. This third inverter INV3 has an input side receiving the first sense amplifier activation signal SE1. Namely, the inverted first sense amplifier activation signal SE1-bar is applied to one input of each of the first and second NOR gates NOR1 and NOR2. Other terminal of the first NOR gate NOR1 is connected to the node SAT. Other terminal of the second NOR gate NOR2 is connected to the node SAB.

The output circuit 4 has a fourth inverter INV4 and a series connection of a third p-channel MOS field effect transistor Q4 and a second n-channel MOS field effect transistor Q5 between a high voltage line and a ground line. The third p-channel MOS field effect transistor Q4 is connected to the high voltage line. The second n-channel MOS field effect transistor Q5 is connected to the ground line. The fourth inverter INV4 has an input side connected to an output side of the second NOR gate NOR2. The third p-channel MOS field effect transistor Q4 has a gate connected to the output of the fourth inverter INV4. The second n-channel MOS field effect transistor Q5 has a gate connected to the output of the first NOR gate NOR1. An output terminal of the latch sense amplifier cirucit is connected to an intermediate node between the third p-channel MOS field effect transistor Q4 and the second n-channel MOS field effect transistor Q5. An output signal SAOUT is outputted from the output terminal.

The following descriptions will focus on operations of the above described latch sense amplifier circuit. A memory cell is selected in data read operation. A small or slight potential difference is generated by the memory cell. This small or slight potential difference is transmitted to the sense amplifier circuit through digit lines not illustrated, read buses RBT and RBB which provide interconnections between the digit lines and the sense amplifier circuit. The small or slight potential difference is further transmitted through the transfer gate 2. The small or slight potential difference appears across the nodes SAT and SAB. Thus, the small or slight potential difference appears across the opposite sides of the closed loop of the first and second inverters INV1 and INV2.

If the first sense amplifier activation signal SE1 becomes high level, then the first n-channel MOS field effect transistor Q1 turns ON, whereby the small or slight potential difference gradually increases and also the potentials of the nodes SAT and SAB drop to an intermediate level between the high voltage level Vcc and the ground level. When a sufficient voltage for amplification is generated across the nodes SAT and SAB, the second sense amplifier activation signal SE2 becomes high level, whereby a power is supplied to the flip-flop 1 and the potential of the node SAT rises up to the high voltage level whilst the potential of the node SAB drops to the ground level. Namely, the potential difference between the nodes SAT and SAB is increased to the potential difference between the high voltage level Vcc and the ground level GND. Since the first sense amplifier activation signal SE1 has been activated in high level, both the first and second NOR gates NOR1 and NOR2 in the next stage buffer 3 are activated, so that data signals on the nodes SAT and SAB are transmitted to the output circuit 4, whereby data read from the selected memory cells are output from the output terminal as an output signal SAOUT.

FIG. 2 is a circuit diagram illustrative of each of first and second NOR gates NOR1 and NOR2 in the next stage buffer 3A in the latch sense amplifier circuit of FIG. 1. Each of the first and second NOR gates NOR1 and NOR2 in the next stage buffer has the normal circuit configuration. In this case, the following problems are raised. The NOR gate comprises two p-channel MOS field effect transistors Q6 and Q7 and two n-channel MOS field effect transistors Q8 and Q9 The two p-channel MOS field effect transistors Q6 and Q7 are connected in series between the high voltage line Vcc and an output node OUT. The two n-channel MOS field effect transistors Q8 and Q9 are connected in parallel to each other between the output node OUT and the ground line GND. Gates of the p-channel MOS field effect transistor Q6 and the n-channel MOS field effect transistor Q8 are connected to the node SAT if the NOR gate is the, fist NOR gate NOR1 or connected to the node SAB if the NOR gate is the second NOR gate NOR2. Gates of the p-channel MOS field effect transistor Q7 and the n-channel MOS field effect transistor Q9 are connected to the output side of the third inverter INV3 for receiving the inverted signal SE1-bar to the first sense amplifier activation signal SE1.

In the first NOR gate NOR1, a node between the two p-channel MOS field effect transistors Q6 and Q7 is defined to be a node 1T. In the second NOR gate NOR2, a node between the two p-channel MOS field effect transistors Q6 and Q7 is defined to be a node 1B. A potential of the node SAT is defined to be a potential Vsat. A potential of the node SAB is defined to be a potential Vsab. A potential of the node 1T is defined to be a potential V1$t$. A potential of the node 1B is defined to be a potential V1$b$. In the first NOR gate NOR1, the potential Vsat is applied to the gates of the p-channel MOS field effect transistor Q6 and the n-channel MOS field effect transistor Q8. A gate-source potential difference Vgs appears amass the gate and source of the p-channel MOS field effect transistor Q6 in the first NOR gate NOR1. This gate-source potential difference Vgs is defined to be Vsat−V1$t$. In the second NOR gate NOR2, the potential Vsab is applied to the gates of the p-channel MOS field effect transistor Q6 and the n-channel MOS field effect transistor Q8. A gate-source potential difference Vgs appears across the gate and source of the p-channel MOS field effect transistor Q6 in the second NOR gate NOR2 his gate-source potential difference Vgs is defined to be Vsab−V1$b$.

Although the potentials of the nodes SAT and SAB has a slight difference from each other, those potentials are almost the same as each other. Namely, the potentials of the nodes SAT and SAB are independent from previous read/write operations of the sense amplifier circuit in the previous cycle. In contrast, potentials of the nodes 1T and 1B depend upon previous read/write operations of the sense amplifier circuit in the previous cycle.

It is assumed that in the previous cycle, data in high level had been outputted as the sense amplifier output SAOUT, and also that the p-channel MOS field effect transistor has a threshold voltage Vthp. Under this assumptions, if the inverted signal SE1-bar to the first sense amplifier activation signal SE1 becomes high level and the read operation is finished, then the potential of the node 1B in the second NOR gate NOR2 becomes Vcc, whilst the potential of the node 1T in the first NOR gate NOR2 becomes Vthp. After the read operation has been finished and then the odes SAT and SAB are again pre-charged at Vcc. Since the potentials of he nodes 1T and 1B are different from each other, a first coupling capacitance C1 between the nodes SAT and 1T in the first NOR gate NOR1 is different from a second coupling capacitance C2 between the nodes SAB and 1B in the second NOR gate NOR2.

In this example, the second coupling capacitance C2 generated between the nodes SAB and 1B in the second NOR gate NOR2 is small whilst the first coupling capacitance C1 between the nodes SAT and 1T in the first NOR gate NOR1 is large. A difference between the first coupling capacitance C1 and the second coupling capacitance C2 causes a potential difference between the nodes SAT and SAB to become small during the read operation. For example, data in low level are about to be outputted as the sense amplifier output SAOUT. This means that the small or slight potential difference is about to be amplified under condition of Vsat<Vsab.

It is considered that the firs sense amplifier activation signal SE1 has been changed from the low level to the high level, the potentials of the nodes SAT and SAB are about to drop to one half of the high voltage level Vcc with keeping the small or slight difference in potential between the nodes SAT and SAB. The potential of the node 1B of the p-channel MOS field effect transistor Q6 is close to the high voltage level Vcc, for which reason a small coupling capacitance appears between the gate and source of the p-channel MOS field effect transistor Q6. The gate voltage level of the p-channel MOS field effect transistor Q6 or the potential of the node SAB is likely to be dropped. In contrast, the potential of the node 1T of the p-channel MOS field effect transistor Q6 is close to the ground level GND, for which reason a large coupling capacitance appears between the gate and source of the p-channel MOS field effect transistor Q6. The rate of drop in gate voltage level of the p-channel MOS field effect transistor Q6 or the potential of the node SAT is likely to be delayed.

Whereas the potential Vsat of the node SAT should have to be kept smaller than the potential Vsab of the node SAB, the potential Vsat of the node SAT may become almost equal to or larger than the potential Vsab of the node SAB during the potentials Vsat and Vsab dropping to one half level of the high voltage level Vcc. Otherwise, the difference between the potentials Vsat and Vsab becomes small. This makes it difficult for the latch sense amplifier circuit to perform the required correct latch operations.

The above described problems are also common to when the next stage buffer comprises a pair of NAND gates in place of the above NOR gates.

The prior art techniques for solving the problems with the operational margin of the sense amplifier are, for example, disclosed in Japanese laid-open patent publications Nos. 62-275394 and 10-11973. Japanese laid-open patent publication No 62-275394 addresses how to solve a different problem from the above described problems, for which reason the prior art technique disclosed in this Japanese publication is incapable of solving the above described problem. Japanese laid-pen patent publication No. 10-11973 addresses how to solve the problem with the parasitic capacitance between the bit lines, for which reason the prior art technique disclosed in this Japanese publication is incapable of solving the above described problem.

In the above stances, it had been required to develop a novel latch sense amplifier circuit with an enlarged latch operational margin free from the above problem.

SUMMARY OF THE INVENTION

Accordingly, it is an object of the present invention to provide a novel latch sense amplifier circuit free from the above problems.

It is a further object of the present invention to provide a novel latch sense amplifier circuit with an enlarged latch operational margin.

The present invention provides a next stage buffer receiving a pair of complementary signals from a flip-flop in a latch sense amplifier circuit. The next stage buffer comprises: a plurality of logic gates of the same type, each of which individually includes a series connection of at least an individual first conductivity type field effect transistor individually provided to the plurality of logic gates and a common first conductivity type field effect transistor commonly provided to the plurality of logic gates, and the common first conductivity type field effect transistor is connected to a carrier supply line which supplies carriers to the common first conductivity type field effect transistor, so that the plurality of logic gates have a common node between the first conductivity type field effect transistors and the common first conductivity type field effect transistor.

The provision of the common first conductivity type field effect transistor forms the common node between the first conductivity type field effect transistors and the common first conductivity type field effect transistor. This configuration causes that potentials of the sources of the individual first conductivity type field effect transistors individually provided in the plural logic gates are equal to each other, whereby no difference in the coupling noise is caused between the plural logic gates in the next stage buffer in the latch sense amplifier. The above novel configuration allows enlarged latch operation margin, and also makes the latch sense amplifier circuit free from the problems described above.

The above and other objects, features and advantages of the present invention will be apparent from the following descriptions.

BRIEF DESCRIPTION OF THE DRAWINGS

Preferred embodiments according to the present invention win be described in detail with reference to the accompanying drawings.

DISCLOSURE OF THE INVENTION

Figure 1:
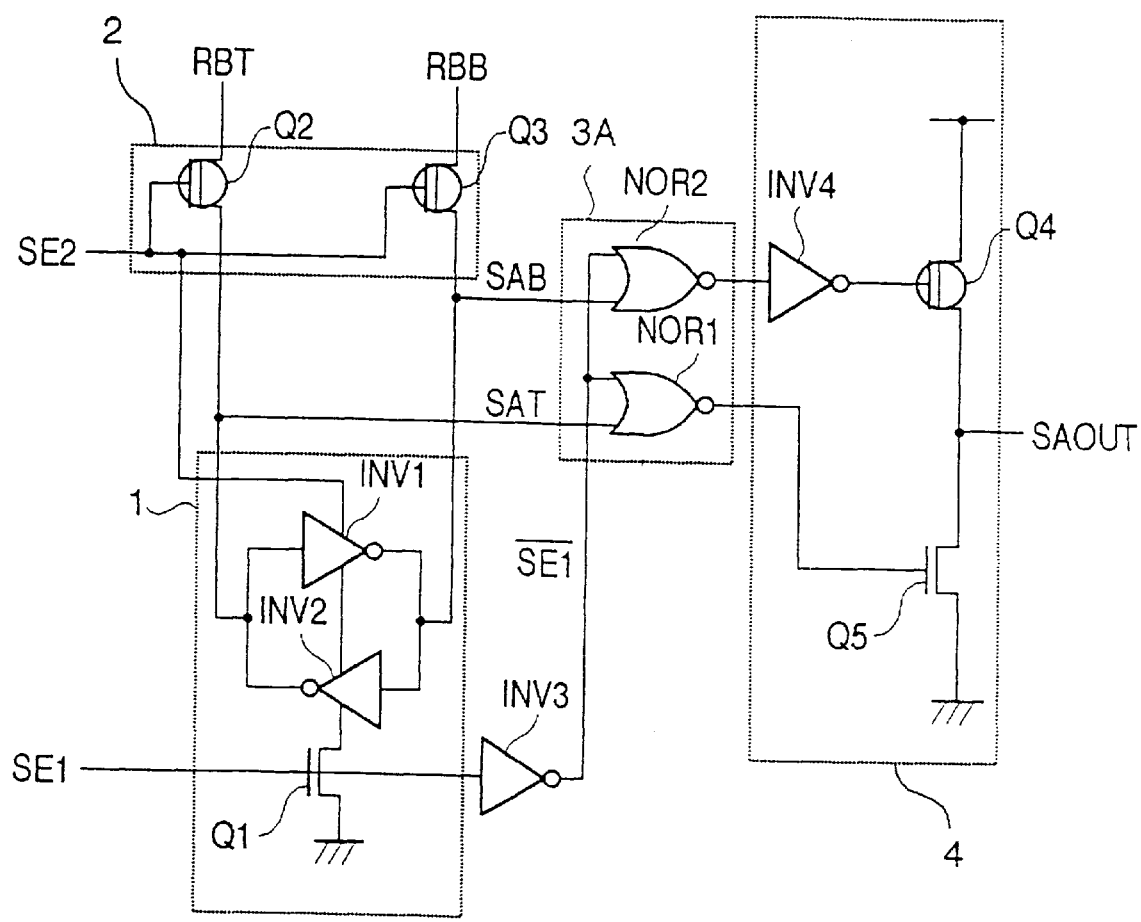
FIG. 1 is a circuit diagram illustrative of a conventional latch sense amplifier circuit.
Figure 2:
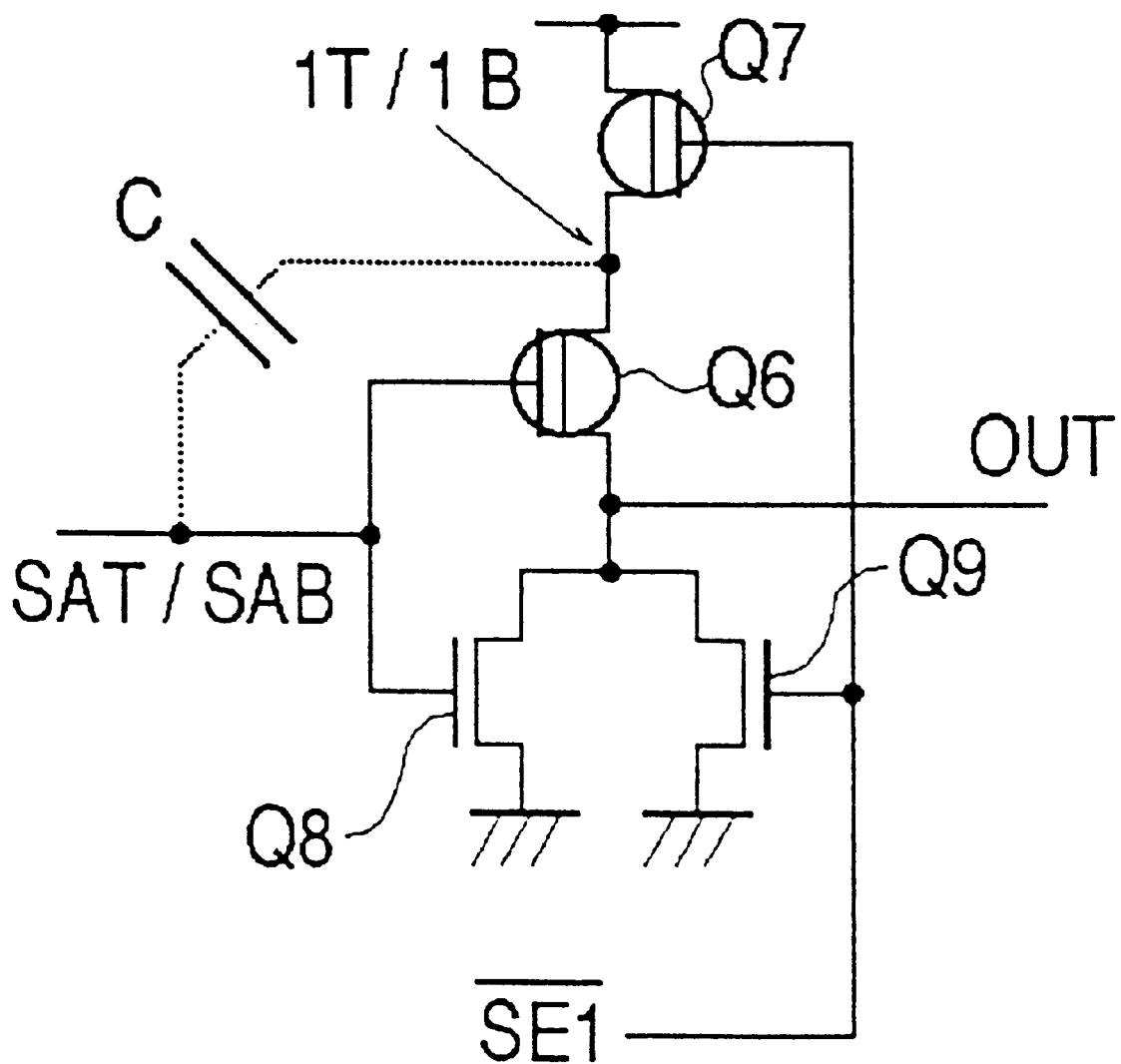
FIG. 2 is a circuit diagram illustrative of each of first and second NOR gates in a next stage buffer in a latch sense amplifier circuit of FIG. 1.

The first present invention provides a next stage buffer receiving a pair of complementary signals from a flip-flop in a latch sense amplifier circuit. The next stage buffer comprises a plurality of logic gates of the same type, each of which individually includes a series connection of at least an individual first conductivity type field effect transistor individually provided to the plurality of logic gates and a common first conductivity type field effect transistor commonly provided to the plurality of logic gates, and the common first conductivity type field effect transistor is connected to a carrier supply line which supplies carriers to the common first conductivity type field effect transistor, so that the plurality of logic gates have a common node between the first conductivity type field effect transistors and the common first conductivity type field effect transistor.

The provision of the common first conductivity type field effect transistor forms the common node between the first conductivity type field effect transistors and the common first conductivity type field effect transistor. This configuration causes that potential of the sources of the individual first conductivity type field effect transistors individually provided in the plural logic gates are equal to each other, whereby no difference in the coupling noise is caused between the plural logic gates in the next stage buffer in the latch sense amplifier. The above novel configuration allows enlarged latch operation margin, and also makes the latch sense amplifier circuit free from the problems described above.

It is possible that the plurality of logic gates comprise two NOR gates, and each of the NOR gates includes a series connection of a single individual first conductivity type field effect transistor and the common first conductivity type field effect transistor connected through the common node to the single individual first conductivity type field effect transistor.

It is further possible that the individual first conductivity type field effect transistor and the common first conductivity type field effect transistor are p-channel MOS field effect transistors and the carrier supply line is a high voltage line.

It is further more possible that the next stage buffer comprises first and second NOR gates. The first NOR gate further comprises a common p-channel MOS field effect transistor connected to a high voltage line, a first individual p-channel MOS field effect transistor connected in series through the common node to the common p-channel MOS field effect transistor, a pair of first and second n-channel MOS field effect transistors connected in parallel to each other between the first individual p-channel MOS field effect transistor and a ground line, a first input terminal connected to gates of the first individual p-channel MOS field effect transistor and one of the paired first and second n-channel MOS field effect transistors, and a second output terminal connected between the first individual p-channel MOS field effect transistor and the paired first and second n-channel MOS field effect transistors. The second NOR gate further comprises the common p-channel MOS field effect transistor, a second individual p-channel MOS field effect transistor connected in series through the common node to the common p-channel MOS field effect transistor, a pair of third and fourth n-channel MOS field effect transistors connected in parallel to each other between the second individual p-channel MOS field effect transistor and the ground line, a second input terminal connected to gates of the second individual p-channel MOS field effect transistor and one of the paired third and fourth n-channel MOS field effect transistors, and a second output terminal connected between the second individual p-channel MOS field effect transistor and the paired third and fourth n-channel MOS field effect transistors.

It is also possible that the next stage buffer comprises first and second NAND gates, and the individual first conductivity type field effect transistor and the common first conductivity type field effect transistor are n-channel MOS field effect transistors and the carrier supply line is a ground fine.

It is further possible that the next stage buffer comprises first and second NAND gates. The first NAND gate further comprises a common n-channel MOS field effect transistor connected to a ground line, a first individual n-channel MOS field effect transistor connected in series through the common node to the common n-channel MOS field effect transistor, a pair of first and second p-channel MOS field effect transistors connected in parallel to each other between the first individual n-channel MOS field effect transistor and a high voltage line, a first input terminal connected to gates of the first individual n-channel MOS field effect transistor and one of the paired first and second p-channel MOS field effect transistors, and a second output terminal connected between the first individual n-channel MOS field effect transistor and the paired first and second p-channel MOS field effect transistors. The second NAND gate further comprises the common n-channel MOS field effect transistor, a second individual n-channel MOS field effect transistor connected in series through the common node to the common n-channel MOS field effect transistor, a pair of third and fourth p-channel MOS field effect transistors connected in parallel to each other between the second individual n-channel MOS field effect transistor and the high voltage line, a second input terminal connected to gates of the second individual n-channel MOS field effect transistor and one of the paired first and second p-channel MOS field effect transistors, and a second output terminal connected between the second individual n-channel MOS field effect transistor and the paired third and fourth p-channel MOS field effect transistors.

The second present invention provides a latch sense amplifier circuit connected to memory cells of a semiconductor memory device. The latch sense amplifier comprises a flip-flop for amplifying data from memory cells to output a pair of complementary signals, a transfer gate connected between data buses and the flip-flop for disconnecting the flip-flop from the data buses in data latch operation, a next stage buffer connected to the flip-flop for receiving the pair of complementary signals, and an output circuit connected to the next stage buffer. The output circuit comprises a plurality of logic gates of the same type, each of which individually includes a series connection of at least an individual first conductivity type field effect transistor individually provided to the plurality of logic gates and a common first conductivity type field effect transistor commonly provided to the plurality of logic gates, and the common first conductivity type field effect transistor being connected to a carrier supply line which supplies carriers to the common first conductivity type field effect transistor, so that the plurality of logic gates have a common node between the first conductivity type field effect transistors and the common first conductivity type field effect transistor.

The provision of the common first conductivity type field effect transistor forms the common node between the first conductivity type field effect transistors and the common first conductivity type field effect transistor. This configuration causes that potentials of the sources of the individual first conductivity type field effect transistors individually provided in the plural logic gates are equal to each other, whereby no difference in the coupling noise is caused between the plural logic gates in the next stage buffer in the latch sense amplifier. The above novel configuration allows enlarged latch operation margin, and also makes the latch sense amplifier circuit free from the problems described above.

It is possible that the plurality of logic gates comprise two NOR gates, and each of the NOR gates includes a series connection of a single individual first conductivity type field effect transistor and the common first conductivity type field effect transistor connected through the common node to the single individual first conductivity type field effect transistor.

It is further possible that the individual first conductivity type field effect transistor and the common first conductivity type field effect transistor are p-channel MOS field effect transistors and the carrier supply line is a high voltage line.

It is furthermore possible that the next stage buffer comprises first and second NOR gates. The first NOR gate further comprises a common p-channel MOS field effect transistor connected to a high voltage line, a first individual p-channel MOS field effect transistor connected in series through the common node to the common p-channel MOS field effect transistor, a pair of first and second n-channel MOS field effect transistors connected in parallel to each other between the first individual p-channel MOS field effect transistor and a ground line, a first input terminal connected to gates of the first individual p-channel MOS field effect transistor and one of the paired first and second n-channel MOS field effect transistors, and a second output terminal connected between the first individual p-channel MOS field effect transistor and the paired first and second n-channel MOS field effect transistors. The second NOR gate further comprises the common p-channel MOS field effect transistor, a second individual p-channel MOS field effect transistor connected in series through the common node to the common p-channel MOS field effect transistor, a pair of third and fourth n-channel MOS field effect transistors connected in parallel to each other between the second individual p-channel MOS field effect transistor and the ground line, a second input terminal connected to gates of the second individual p-channel MOS field effect transistor and one of the paired third and fourth n-channel MOS field effect transistors, and a second output terminal connected between the second individual p-channel MOS field effect transistor and the paired third and fourth n-channel MOS field effect transistors.

It is also possible that the next stage buffer comprises first and second NAND gates, and the individual first conductivity type field effect transistor and the common first conductivity type field effect transistor are n-channel MOS field effect transistors and the carrier supply line is a ground line.

It is further possible that the next stage buffer comprises first and second NAND gates. The first NAND gate further comprises a common n-channel MOS field effect transistor connected to a ground line, a first individual n-channel MOS field effect transistor connected in series through the common node to the common n-channel MOS field effect transistor, a pair of first and second p-channel MOS field effect transistors connected in parallel to each other between the first individual n-channel MOS field effect transistor and a high voltage line, a first input terminal connected to gates of the first individual n-channel MOS field effect transistor and one of the paired first and second p-channel MOS field effect transistors, and a second output terminal connected between the first individual n-channel MOS field effect transistor and the paired first and second p-channel MOS field effect transistors. The second NAND gate further comprises the common n-channel MOS field effect transistor, a second individual n-channel MOS field effect transistor connected in series through the common node to the common n-channel MOS field effect transistor, a pair of third and fourth p-channel MOS field effect transistors connected in parallel to each other between the second individual n-channel MOS field effect transistor and the high voltage line, a second input terminal connected to gates of the second individual n-channel MOS field effect transistor and one of the paired first and second p-channel MOS field effect transistors; and a second output terminal connected between the second individual n-channel MOS field effect transistor and the paired third and fourth p-channel MOS field effect transistors.

PREFERRED EMBODIMENTS

First Embodiment

Figure 3:
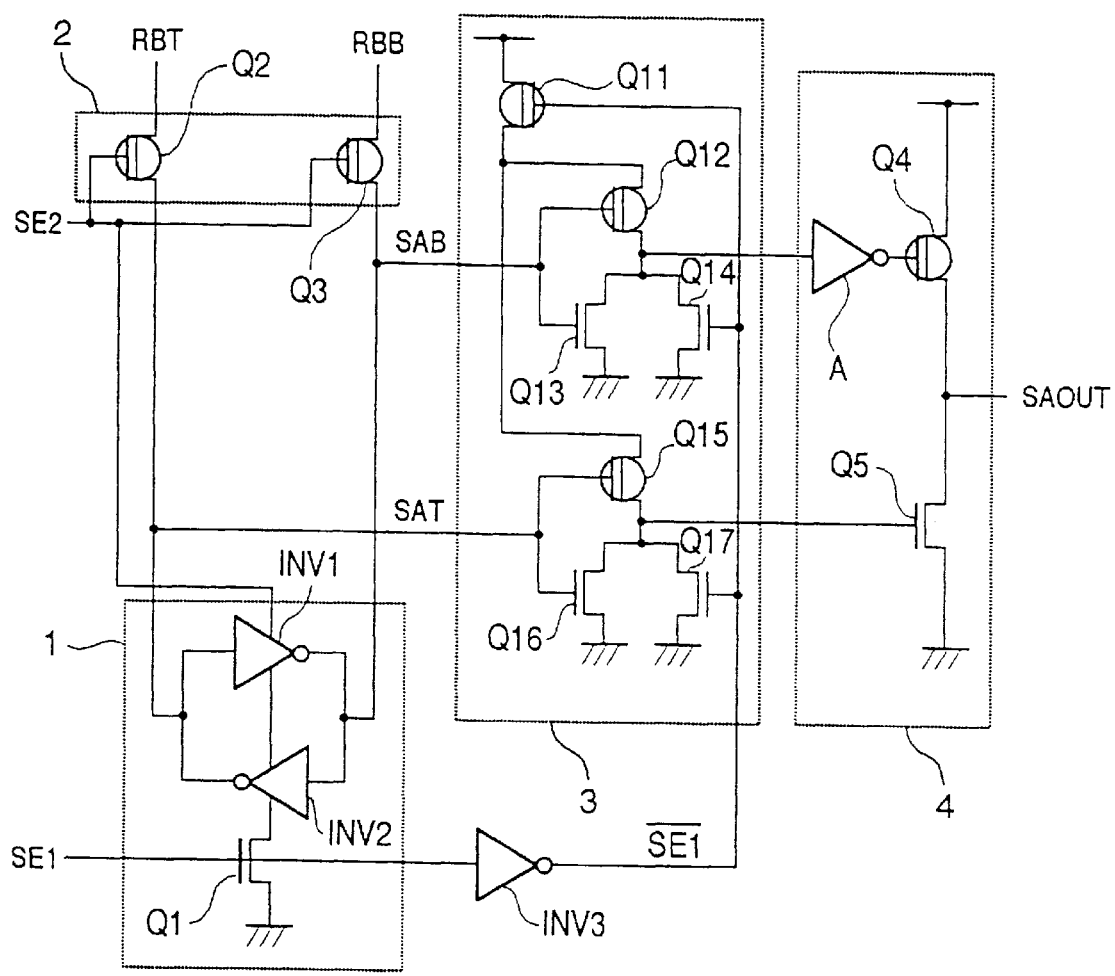
FIG. 3 is a circuit diagram illustrative of a first novel latch sense amplifier circuit in a first embodiment in accordance with the present invention.

A first embodiment according to the present invention will be described in detail with reference to the drawings. FIG. 3 is a circuit diagram illustrative of a first novel latch sense amplifier circuit in a first embodiment in accordance with the present invention. The novel latch sense amplifier circuit comprises a flip-flop 1, a transfer gate 2, a next stage buffer 3 and an output circuit 4. The flip-flop 1 performs a high speed amplification of data from memory cells up to a level defined to be a difference of a high power voltage Vcc from a ground potential GND so as to output paired complementary signals therefrom. The transfer gate 2 is connected between the flip-flop 1 and the read buses RBT and RBB, so that the transfer gate 2 performs disconnecting the flip-flop 1 from read buses RBT and RBB for latching data from the memory cells. The next stage buffer 3 is connected to an output side of the flip-flop 1 for receiving the amplified complementary signals from the flip-flop 1. The output circuit 4 are connected to the next stage buffer 3 for receiving output from the next stage buffer 3 to output the amplified memory cell data.

The flip-flop 1 has a parallel connection of first and second inverters INV1 and INV2 between both nodes SAT and SAB. Directions of the first and second inverters INV1 and INV2 are opposite to each other to form a closed loop. Namely, an output side of the first inverter INV1 is connected to an input side of the second inverter INV2 and an output side of the second inverter INV2 is connected to an input side of the first inverter INV1. Power terminals of the first and second inverters INV1 and INV2 are supplied with a second sense amplifier activation signal SE2. If the second sense amplifier activation signal SE2 is low level or inactivated level, then the flip-flop 1 is inactivated to be inoperable. Ground terminals of the first and second inverters INV1 and INV2 are connected through an n-channel MOS field effect transistor Q1 to a ground line GND. The n-channel MOS field effect transistor Q1 has a gate receiving a first sense amplifier activation signal SE1. If the first sense amplifier activation signal SE1 is low level, then the nodes SAT and SAB are kept to be the high power voltage level Vcc.

The transfer gate 2 has first and second p-channel MOS field effect transistors Q2 and Q3 which have gates receiving the second sense amplifier activation signal SE2 The first p-channel MOS field effect transistor Q2 is connected in series between the lead bus RBT and the node SAT. The second p-channel MOS field effect transistor Q3 is connected in series between the read bus RBB and the node SAB which are connected to the opposite sides of the closed loops. If the second sense amplifier activation signal SE2 is high level, then the flip-flop 1 is disconnected from the read buses RBT and RBB.

The next stage buffer 3 is different from the conventional one described above. The present invention has been achieved to improve the next stage buffer 3 to avoid the above problems with the difference in coupling capacitance between the two logic gates which form the next stage buffer 3. The above problem with the difference in coupling capacitance between the two logic gates is caused by the difference in potential of the intermediate nodes between the two MOS field effect transistors connected in series to each other in the first and second logic gates of the conventional next stage buffer. For this reason, in the novel next stage buffer, the intermediate node between the two MOS field effect transistors connected in series to each other is common to the first and second logic gates of the novel next stage buffer, so that no difference is caused in potential of the intermediate node between the two MOS field effect transistors connected in series to each other in the first and second logic gates of the novel next stage buffer.

The next stage buffer 3 has a pair of first and second NOR gates. The first and second NOR gates have a common fist p-channel MOS field effect transistor Q11. The common first p-channel MOS field effect transistor Q11 is thus provided commonly to the first and second NOR gates. The first NOR gate has the common p-channel MOS field effect transistor Q11 connected to a high voltage line. The fist NOR gate also has a p-channel MOS field effect transistor Q12 connected in series through a common node to the common p-channel MOS field effect transistor Q11. The first NOR gate also has a pair of first and second n-channel MOS field effect transistors Q13 and Q14 connected in parallel to each other between the p-channel MOS field effect transistor Q12 and a ground line GND. The first NOR gate also has a first input terminal connected to the node SAB and also connected to gates of the p-channel MOS field effect transistor Q12 and the n-channel MOS field effect transistor Q13. The first NOR gate also has a first output terminal connected between the p-channel MOS field effect transistor Q12 and the paired n-channel MOS field effect transistors Q13 and Q14.

The second NOR gate has the common p-channel MOS field effect transistor. The second NOR gate also has a p-channel MOS field effect transistor Q15 connected in series through the common node to the common p-channel MOS field effect transistor Q11. The second NOR gate also has a pair of n-channel MOS field effect transistors Q16 and Q17 connected in parallel to each other between the p-channel MOS field effect transistor Q15 and the ground line GND. The second NOR gate also has a second input terminal connected to gates of the p-channel MOS field effect transistor Q15 and the n-channel MOS field effect transistor Q16. The second NOR gate also has a second output terminal connected between the p-channel MOS field effect transistor Q15 and the n-channel MOS field effect transistor Q17.

A third inverter INV3 is provided which has an input side receiving a first sense amplifier activation signal SE1 and an output side connected to gates of the common p-channel MOS field effect transistor Q11, the n-channel MOS field effect transistors Q14 and Q17, so that an inverted signal SE1-bar to the first sense amplifier activation signal SE1 is applied to the gates of the common p-channel MOS field effect transistor Q11, the n-channel MOS field effect transistors Q14 and Q17.

The output circuit 4 has a fourth inverter A and a series connection of a third p-channel MOS field effect transistor Q4 and a second n-channel MOS field effect transistor Q5 between a high voltage line and a ground line. The third p-channel MOS field effect transistor Q4 is connected to the high voltage line. The second n-channel MOS field effect transistor Q5 is connected to the ground line. The fourth inverter A has an input side connected to an output side of the second NOR gate NOR2. The third p-channel MOS field effect transistor Q4 has a gate connected to the output of the fourth inverter A. The second n-channel MOS field effect transistor Q5 has a gate connected to the output of the first NOR gate NOR1. An output terminal of the latch sense amplifier circuit is connected to an intermediate node between the third p-channel MOS field effect transistor Q4 and the second n-channel MOS field effect transistor Q5. An output signal SAOUT is outputted from the output terminal.

Figure 4:
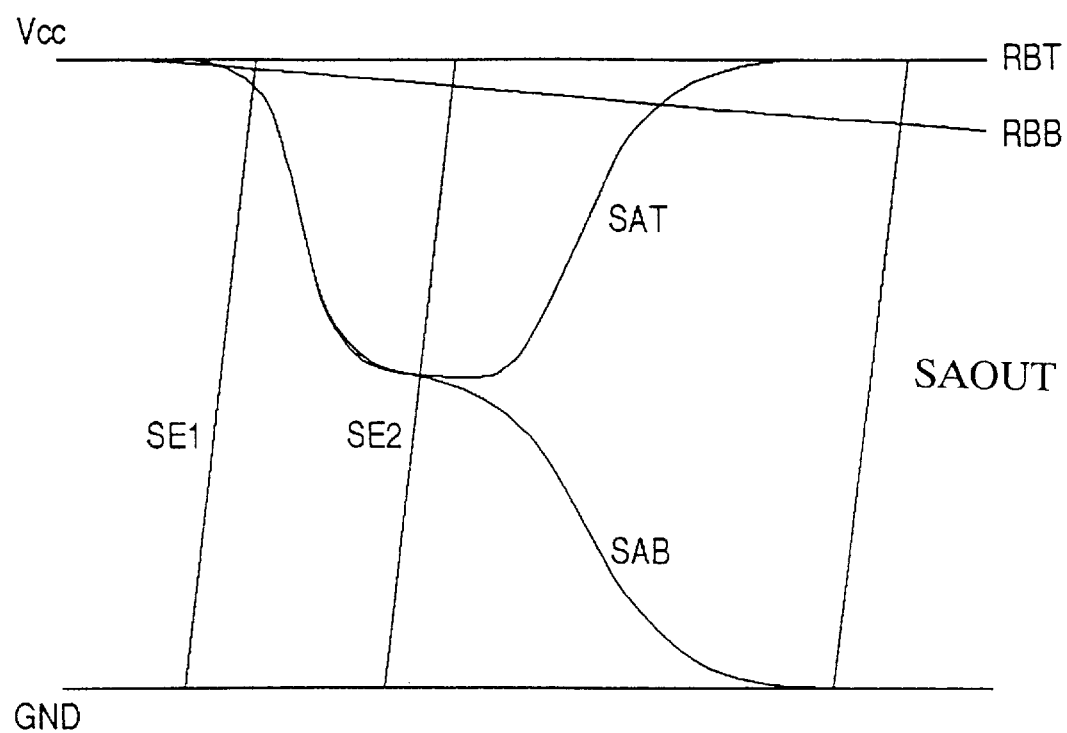
FIG. 4 is a diagram illustrative of signal waveforms of the novel latch sense amplifier circuit of FIG. 3.

The following descriptions will focus on operations of the above described latch sense amplifier circuit. A memory cell is selected in data read operation FIG. 4 is a diagram illustrative of signal waveforms of the novel latch sense amplifier circuit of FIG. 3. A small or slight potential difference is generated by the memory cell. This small or slight potential difference is transmitted to the sense amplifier circuit through digit lines not illustrated, read buses RBT and RBB which provide interconnections between the digit lines and the sense amplifier circuit. The small or slight potential difference is further transmitted through the transfer gate 2. The small or slight potential difference appears across the nodes SAT and SAB. Thus, the small or slight potential difference appears across the opposite sides of the closed loop of the first and second inverters INV1 and INV2.

If the first sense amplifier activation signal SE1 becomes high level, then the first n-channel MOS field effect transistor Q1 turns ON, whereby the small or slight potential difference gradually increases and also the potentials of the nodes SAT and SAB drop to an intermediate level between the high voltage level Vcc and the ground level. When a sufficient voltage for amplification is generated across the nodes SAT and SAB, the second sense amplifier activation signal SE2 becomes high level, whereby a power is supplied to the flip-flop 1 and the potential of the node SAT rises up to the high voltage level whilst the potential of the node SAB drops to the ground level. Namely, the potential difference between the nodes SAT and SAB is increased to the potential difference between the high voltage level Vcc and the ground level GND. Since the first sense amplifier activation signal SE1 has been activated in high level, both the first and second NOR gates NOR1 and NOR2 in the next stage buffer 3 are activated, so that data signals on the nodes SAT and SAB are transmitted to the output circuit 4, whereby data lead from the selected memory cells are output from the output terminal as an output signal SAOUT.

It is assumed that in the previous cycle, data in either high or low level had been outputted as the sense amplifier output SAOUT, and also that the p-channel MOS field effect transistor has a threshold voltage Vthp. Under this assumptions, if the inverted signal SE1-bar to the first sense amplifier activation signal SE1 becomes high level and the read operation is finished, then the potential of the common node in the second NOR gate becomes Vcc, and also the potential of the common node in the first NOR gate becomes Vcc. After the read operation has been finished and then the nodes SAT and SAB are again pre-charged at Vcc. Since the potential of the common node to the first and second NOR gates has a single potential, a first coupling capacitance between the node SAT and the common node in the first NOR gate is identical with a second coupling capacitance between the node SAB and the common node in the second NOR gate.

For example, low level data is about to be outputted as the sense amplifier output SAOUT. This means that the small or slight potential difference is about to be amplified under condition of Vsat<Vsab. The first sense amplifier activation signal SE1 has been changed from the low level to the high level. The potentials of the nodes SAT and SAB are about to drop to one half of the high voltage level Vcc with keeping the small or slight difference in potential between the nodes SAT and SAB. The potential of the common node of the p-channel MOS field effect transistor Q12 is close to the high voltage level Vcc, for which reason a small coupling capacitance appears between the gate and source of the p-channel MOS field effect transistor Q12. The gate voltage level of the p-channel MOS field effect transistor Q12 or the potential of the node SAB is likely to be dropped Similarly, the potential of the common node of the p-channel MOS field effect transistor Q15 is close to the high voltage level Vcc, for which reason a small coupling capacitance appears between the gate and source of the p-channel MOS field effect transistor Q15. The rate of drop in gate voltage level of the p-channel MOS field effect transistor Q12 or the potential of the node SAB is identical with the rate of drop in gate voltage level of the p-channel MOS field effect transistor Q15 or the potential of the node SAT.

The potential Vsat of the node SAT should have to be kept smaller than the potential Vsab of the node SAB. The potential Vsat of the node SAT is kept smaller than the potential Vsab of the node SAB during the potentials Vsat and Vsab dropping to one half level of the high voltage level Vcc. This makes it possible for the latch sense amplifier circuit to perform the required correct latch operations.

Accordingly, the common node and the common p-channel MOS field effect transistor Q11 causes that the source potentials of the p-channel MOS field effect transistors Q12 and Q15 are identical with each other, for which reason the gate-source coupling capacitance is the same between the p-channel MOS field effect transistors Q12 and Q15, whereby the rate of drop in gate voltage level of the p-channel MOS field effect transistor Q12 or the potential of the node SAB is identical with the rate of drop in gate voltage level of the p-channel MOS field effect transistor Q15 or the potential of the node SAT. The potential Vsat of the node SAT is kept smaller than the potential Vsab of the node SAB during the potentials Vsat and Vsab dropping to one half level of the high voltage level Vcc. This makes it possible for the latch sense amplifier circuit to perform the required correct latch operations.

Figure 5:
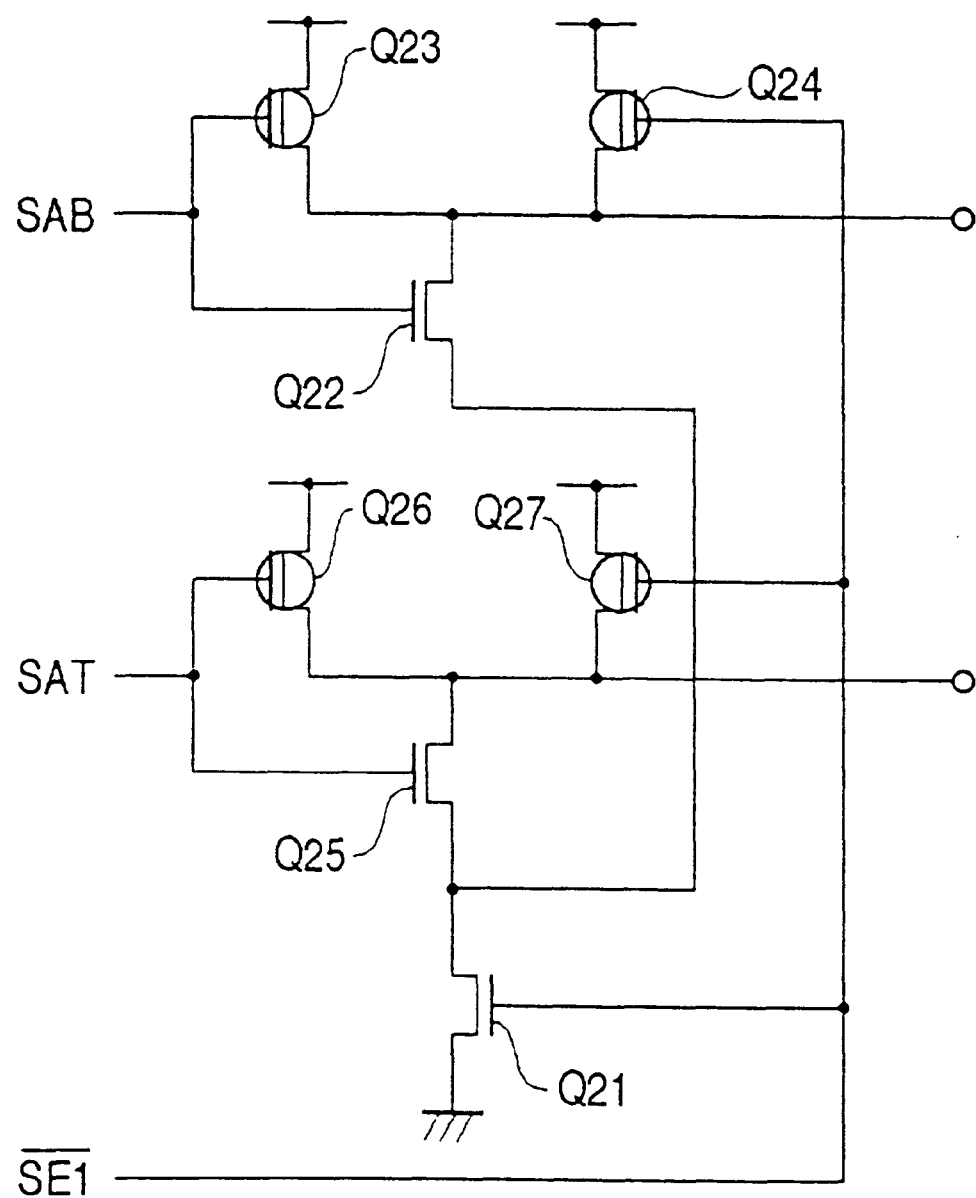
FIG. 5 is a circuit diagram illustrative of another circuit configuration of the next stage buffer comprising two NAND gates in the novel latch sense amplifier circuit of FIG. 3.

FIG. 5 is a circuit diagram illustrative of another circuit configuration of the next stage buffer comprising two NAND gates in the novel latch sense amplifier circuit of FIG. 3.

If the next stage buffer 3 comprises NAND gates, the circuit configuration is as follows. The next stage buffer 3 has a pair of first and second NAND gates. The first and second NAND gates have a common n-channel MOS field effect transistor Q21. The common n-channel MOS field effect transistor Q21 is thus provided commonly to the first and second NAND gates. The first NAND gate has the common n-channel MOS field effect transistor Q21 connected to a ground line. The first NAND gate also has an n-channel MOS field effect transistor Q22 connected in series through a common node to the common n-channel MOS field effect transistor Q21. The first NAND gate also has a pair of p-channel MOS field effect transistors Q23 and Q24 connected in parallel to each other between the n-channel MOS field effect transistor Q22 and a high voltage line Vcc. The first NAND gate also has a first input terminal connected to the node SAB and also connected to gates of the n-channel MOS field effect transistor Q22 and the p-channel MOS field effect transistor Q23. The first NAND gate also has a first output terminal connected between the n-channel MOS field effect transistor Q22 and the paired p-channel MOS field effect transistors Q23 and Q24.

The second NAND gate has the common n-channel MOS field effect transistor Q21 The second NAND gate also has an n-channel MOS field effect transistor Q25 connected in series through the common node to the common n-channel MOS field effect transistor Q21. The second NAND gate also has a pair of p-channel MOS field effect transistors Q26 and Q27 connected in parallel to each other between the n-channel MOS field effect transistor Q25 and the high voltage line Vcc. The second NAND gate also has a second input terminal connected to the node SAT and also connected to gates of the n-channel MOS field effect transistor Q25 and the p-channel MOS field effect transistor Q26. The second NAND gate also has a second output terminal connected between the n-channel MOS field effect transistor Q25 and the p-channel MOS field effect transistor Q27.

Accordingly, the common node and the common n-channel MOS field effect transistor Q21 causes that the source potentials of the n-channel MOS field effect transistors Q22 and Q25 are identical with each other, for which reason the gate-source coupling capacitance is the same between the n-channel MOS field effect transistors Q22 and Q25, whereby the rate of drop in gate voltage level of the n-channel MOS field effect transistor Q22 or the potential of the node SAB is identical with the rate of drop in gate voltage level of the n-channel MOS field effect transistor Q25 or the potential of the node SAT. The potential Vsat of the node SAT is kept smaller than the potential Vsab of the node SAB during the potentials Vsat and Vsab dropping to one half level of the high voltage level Vcc. This makes it possible for the latch sense amplifier circuit to perform the required correct latch operations.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A next stage buffer receiving a pair of complementary signals from a flip-flop in a latch sense amplifier circuit, said next stage buffer comprising:
   a plurality of logic gates of the same type, wherein each logic gate comprises at least one individual first conductivity type field effect transistor;
   a common first conductivity type field effect transistor having one node connected to a carrier supply line,
   wherein said plurality of logic gates and said common first conductivity type field effect transistor are connected to a common node between said first conductivity type field effect transistors and said common first conductivity type field effect transistor.

2. The next stage buffer as claimed in claim 1, wherein said plurality of logic gates further comprise first and second NOR gates.

3. The next stage buffer as claimed in claim 1, wherein said at least one individual first conductivity type field effect transistor and said common first conductivity type field effect transistor are p-channel MOS field effect transistors.

4. The next stage buffer as claimed in claim 3, wherein said next stage buffer comprises first and second NOR gates and a common p-channel MOS field effect transistor connected to a high voltage line,
   said first NOR gate further comprising:
      a first individual p-channel MOS field effect transistor connected in series through said common node to said common p-channel MOS field effect transistor;
      a pair of first and second n-channel MOS field effect transistors connected in parallel to each other between said first individual p-channel MOS field effect transistor and a ground line;
      a first input terminal connected to a gate of said first individual p-channel MOS field effect transistor and a gate of one of said paired first and second n-channel MOS field effect transistors; and
      a first output terminal connected between said first individual p-channel MOS field effect transistor and said paired first and second n-channel MOS field effect transistors, and
   said second NOR gate further comprising:
      a second individual p-channel MOS field effect transistor connected in series through said common node to said common p-channel MOS field effect transistor;
      a pair of third and fourth n-channel MOS field effect transistors connected in parallel to each other between said second individual p-channel MOS field effect transistor and said ground line;
      a second input terminal connected to a gate of said second individual p-channel MOS field effect transistor and a gate of one of said paired third and fourth n-channel MOS field effect transistors; and
      a second output terminal connected between said second individual p-channel MOS field effect transistor and said paired third and fourth n-channel MOS field effect transistors.

5. The next stage buffer as claimed in claim 1, wherein said plurality of logic gates comprise first and second NAND gates.

6. The next stage buffer as claimed in claim 5, wherein said next stage buffer comprises first and second NAND gates and a common n-channel MOS field effect transistor connected to a ground line,
   said first NAND gate further comprising:
      a first individual n-channel MOS field effect transistor connected in series through said common node to said common n-channel MOS field effect transistor;
      a pair of first and second p-channel MOS field effect transistors connected in parallel to each other between said first individual n-channel MOS field effect transistor and a high voltage line;
      a first input terminal connected to a gate of said first individual n-channel MOS field effect transistor and a gate of one of said paired first and second p-channel MOS field effect transistors; and
      a first output terminal connected between said first individual n-channel MOS field effect transistor and said paired first and second p-channel MOS field effect transistors, and
   said second NAND gate further comprising:
      a second individual n-channel MOS field effect transistor connected in series through said common node to said common n-channel MOS field effect transistor;
      a pair of third and fourth p-channel MOS field effect transistors connected in parallel to each other between said second individual n-channel MOS field effect transistor and said high voltage line;
      a second input terminal connected to a gate of said second individual n-channel MOS field effect transistor and a gate of one of said paired first and second p-channel MOS field effect transistors; and
      a second output terminal connected between said second individual n-channel MOS field effect transistor and said paired third and fourth p-channel MOS field effect transistors.

7. A latch sense amplifier circuit connected to memory cells of a semiconductor memory device, said latch sense amplifier comprising:
   a flip-flop that amplifies data from memory cells and outputs a pair of complementary signals;
   a transfer gate connected between data buses and said flip-flop for disconnecting said flip-flop from said data buses;
   a next stage buffer connected to said flip-flop for receiving said pair of complementary signals;
   an output circuit connected to said next stage buffer,
   wherein said next stage buffer comprises:
      a plurality of logic gates of the same type, wherein each logic gate comprises at least one individual first conductivity type field effect transistor;
      a common first conductivity type field effect transistor having one node connected to a carrier supply line, wherein said plurality of logic gates and said common first conductivity type field effect transistor are connected to a common node between said first conductivity type field effect transistors and said common first conductivity type field effect transistor.

8. The latch sense amplifier circuit as claimed in claim 7, wherein said plurality of logic gates comprise first and second NOR gates.

9. The latch sense amplifier circuit as claimed in claim 7, wherein said at least one individual first conductivity type field effect transistor and said common first conductivity type field effect transistor are p-channel MOS field effect transistors.

10. The latch sense amplifier circuit as claimed in claim 9, wherein said next stage buffer comprises first and second NAND gates and a common n-channel MOS field effect transistor connected to a ground line,
   said first NAND gate further comprising:
      a first individual n-channel MOS field effect transistor connected in series through said common node to said common n-channel MOS field effect transistor;
      a pair of first and second p-channel MOS field effect transistors connected in parallel to each other between said first individual n-channel MOS field effect transistor and a high voltage line;
      a first input terminal connected to a gate of said first individual n-channel MOS field effect transistor and a gate of one of said paired first and second p-channel MOS field effect transistors; and
      a first output terminal connected between said first individual n-channel MOS field effect transistor and said paired first and second p-channel MOS field effect transistors, and
   said second NAND gate further comprising:
      a second individual n-channel MOS field effect transistor connected in series through said common node to said common n-channel MOS field effect transistor;
      a pair of third and fourth p-channel MOS field effect transistors connected in parallel to each other between said second individual n-channel MOS field effect transistor and said high voltage line;
      a second input terminal connected to a gate of said second individual n-channel MOS field effect transistor and a gate of one of said paired first and second p-channel MOS field effect transistors; and
      a second output terminal connected between said second individual n-channel MOS field effect transistor and said paired third and fourth p-channel MOS field effect transistors.

11. The latch sense amplifier circuit as claimed in claim 8, wherein said plurality of logic gates comprise first and second NAND gates.

12. The latch sense amplifier circuit as claimed in claim 11, wherein said next stage buffer comprises first and second NAND gates and a common n-channel MOS field effect transistor connected to a ground line,
   said first NAND gate further comprising:
      a first individual n-channel MOS field effect transistor connected in series through said common node to said common n-channel MOS field effect transistor;
      a pair of first and second p-channel MOS field effect transistors connected in parallel to each other between said first individual n-channel MOS field effect transistor and a high voltage line;
      a first input terminal connected to a gate of said first individual n-channel MOS field effect transistor and a gate of one of said paired first and second p-channel MOS field effect transistors; and
      a first output terminal connected between said first individual n-channel MOS field effect transistor and said paired first and second p-channel MOS field effect transistors, and
   said second NAND gate further comprising:
      a second individual n-channel MOS field effect transistor connected in series through said common node to said common n-channel MOS field effect transistor;
      a pair of third and fourth p-channel MOS field effect transistors connected in parallel to each other between said second individual n-channel MOS field effect transistor and said high voltage line;
      a second input terminal connected to a gate of said second individual n-channel MOS field effect transistor and a gate of one of said paired first and second p-channel MOS field effect transistors; and
      a second output terminal connected between said second individual n-channel MOS field effect transistor and said paired third and fourth p-channel MOS field effect transistors.

13. The next stage buffer as claimed in claim 1, wherein said carrier supply line is a high voltage line.

14. The latch sense amplifier circuit as claimed in claim 7, wherein said carrier supply line is a high voltage line.

* * * * *